US006207978B1

United States Patent
Fastow

(10) Patent No.: US 6,207,978 B1
(45) Date of Patent: Mar. 27, 2001

(54) FLASH MEMORY CELLS HAVING A MODULATION DOPED HETEROJUNCTION STRUCTURE

(75) Inventor: Richard Fastow, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/516,472

(22) Filed: Mar. 1, 2000

(51) Int. Cl.$^7$ .......... H01L 29/812; H01L 29/788
(52) U.S. Cl. .......... 257/192; 257/316; 257/321; 257/616
(58) Field of Search .......... 257/192, 316, 257/321, 616, 314, 315

(56) References Cited

U.S. PATENT DOCUMENTS 5,814,854 * 9/1998 Liu et al. .............. 257/315
6,023,079 * 2/2000 Hida .................. 257/192

* cited by examiner

Primary Examiner—Minh Loan Tran
(74) Attorney, Agent, or Firm—H. Donalo Nelson

(57) ABSTRACT

A flash memory device and a method to manufacture the flash memory device. The flash memory device includes a modulation-doped heterostructure formed in a semiconductor substrate, a layer of tunnel oxide, a floating gate, a layer of dielectric, a control gate and source and drain regions formed in the substrate.

12 Claims, 7 Drawing Sheets

FLASH MEMORY CELLS HAVING A MODULATION DOPED HETEROJUNCTION STRUCTURE

BACKGROUND OF THE INVENTION

1. Field of the Invention

This invention relates generally to the art of microelectronic integrated circuits. More specifically, this invention relates to flash Electrically Erasable Programmable Read Only Memory (EEPROM) devices. Even more specifically, this invention relates to flash memory cells having high mobility and a method to manufacture the high mobility flash memory cell. Still even more specifically, this invention relates to flash memory cells have a modulation doped heterojunction structure.

2. Discussion of the Related Art

A class of non-volatile memory devices known as "flash" EEPROM (Electrically Erasable Programmable Read Only Memory) devices combines the advantages of EPROM density with the electrical erasability of an EEPROM. One feature that distinguishes flash EEPROM memory cells from standard EEPROM memory cells is that unlike standard EEPROM memory cells, flash EEPROM memory cells do not contain a select transistor on a one-for-one basis with each floating gate memory cell. A select transistor is a transistor that allows the selection of an individual memory cell within the memory device and is used to selectively erase a specific memory cell. Because flash EEPROMs do not have a select transistor for each floating gate transistor, flash EEPROM memory cells cannot be individually erased and therefore must be erased in bulk, either by erasing the entire chip or by erasing paged groups or banks of cells. Elimination of the select transistor allows for smaller cell size and gives the flash EEPROM an advantage in terms of manufacturing yield (in terms of memory capacity) over comparably sized standard EEPROMs.

Typically, a plurality of flash EEPROM cells is formed on a semiconductor substrate, which is also known as a silicon wafer. FIG. 1A illustrates a single conventional flash EEPROM memory cell having a double-diffused source region. As shown in FIG. 1, flash memory cell 100 is formed on a p-type substrate 110 and includes an n type double-diffused source region 102 and an n+ drain region 104. The drain region 104 and the source region 102 are spaced apart from each other forming a channel $L_{CHANNEL}$ 122. A source electrode 114 and a drain electrode 112 are connected to the source region 102 and the drain region 104, respectively. A substrate electrode 105 is connected to the substrate 110.

The double-diffused source region 102 is formed of a lightly doped n region 128 (phosphorous doped) and a more heavily doped but shallower n+ region 130 (arsenic doped) embedded within the deep n region 128. The phosphorus doping within the n region 128 reduces the horizontal electric field between the source region 102 and the substrate 110.

The floating gate 106 is disposed a short distance above the source region 102, the drain region 104 and the channel $L_{CHANNEL}$ 122, over a dielectric layer 118, which is also known as a tunnel oxide region. Above the floating gate 106 and disposed over the dielectric layer 116 is a control gate 108. The dielectric layer 116 is typically formed of an oxide/nitride/oxide layer known in the semiconductor manufacturing art as an ONO layer. A control gate electrode 120 is attached to control gate 108. The dimension $L_{GATE}$ 132 represents the gate length for the gates contained in flash memory cell 100.

In a conventional method of operation, the programming of a flash EEPROM memory cell is achieved by inducing "hot electron" injection from a section of the channel 122 near the drain 104 into the floating gate 106. The injected electrons cause the floating gate 106 to carry a negative charge. Grounding the source region 102, biasing the control gate 108 to a relatively high positive voltage and biasing the drain region 104 to a moderate positive voltage induce the hot electrons.

For example, to program the flash memory cell 100 the source electrode 114 is connected to ground, the drain electrode 112 is connected to a relatively high voltage (typically +4 volts to +9 volts) and the control gate electrode 120 is connected to a relatively high voltage level (typically +8 volts to +12 volts). Electrons are accelerated from source region 102 to drain region 104 via the channel 122 and the "hot electrons" are generated near the drain region 104. Some of the hot electrons are injected through he relatively thin gate dielectric layer 118 and become trapped in the floating gate 106 thereby giving floating gate 106 a negative potential.

After sufficient negative charge accumulates on floating gate 106 the negative potential of floating gate 106 raises the threshold voltage of the stacked gate transistor and inhibits current flow through the channel 122 during a subsequent "read" mode. The magnitude of the read current is used to determine whether a memory cell has been programmed.

Conversely, to erase a flash memory device electrons are typically driven out of the floating gate 106 by biasing the control gate 108 to a large negative voltage and biasing the source region 102 to a low positive voltage in order to produce a sufficiently large vertical electric field in the tunnel oxide. The large vertical field 136 in the tunnel oxide produces Fowler-Nordheim (F-N) tunneling of electrons stored in the floating gate 106 through the tunnel oxide into the source region 102. The charge removed from the floating gate 106 produces a threshold voltage shift.

For example, during erasure a relatively low positive voltage (typically from +0.5 volts to +5 volts) is applied to source electrode 114 and a relatively large negative voltage (typically from -7 volts to -13 volts) is applied to control gate electrode 120. The voltage of the substrate electrode 126 is grounded and the drain electrode 112 is allowed to float. The vertical electric filed established between the control gate 108 and the source region 102 induces electrons previously stored in floating gate 106 to pass through dielectric layer 118 and into source region 102 by way of Fowler-Nordheim tunneling.

However, the operation of the prior art flash memory cell is limited by the lack of carrier mobility. The lack of mobility also limits the continued scaling of the prior art flash memory cell.

Therefore, what is needed is a flash memory cell with increased carrier mobility and drive current that permits a larger window of operation and that allows a continued scaling of the dimension of the flash memory cell.

SUMMARY OF THE INVENTION

According to the present invention, the foregoing and other objects and advantages are achieved by a flash memory device and a method of making the flash memory device having a modulation-doped heterostructure.

In accordance with an aspect of the present invention, the modulation-doped heterostructure is formed in a semiconductor substrate, a layer of tunnel oxide is formed on a surface of the semiconductor substrate, a floating gate and a control gate separated by a layer of dielectric are formed on the layer of tunnel oxide and source and drain regions are formed in the substrate.

In accordance with an aspect of the present invention, the modulation-doped heterostructure includes a layer of silicon that acts as a quantum well that becomes an electron channel under positive bias.

In accordance with another aspect of the present invention, the modulation-doped heterostructure also includes a layer of silicon germanium and a silicon cap layer on the layer of silicon.

In accordance with another aspect of the present invention, the modulation-doped heterostructure further includes an n-doped layer of silicon germanium, a p-doped layer of silicon germanium, a spacer layer of silicon germanium between the doped layers of silicon germanium and a set back layer between the n-doped layer and the layer of silicon.

The described flash memory device and method of manufacturing the flash memory device thus provides a flash memory device with increased carrier mobility and drive current that permits a larger window of operation and that allows a continued scaling of the dimension of the flash memory device.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention that illustrates the best mode presently contemplated by the inventors for practicing the invention.

Figure 1:
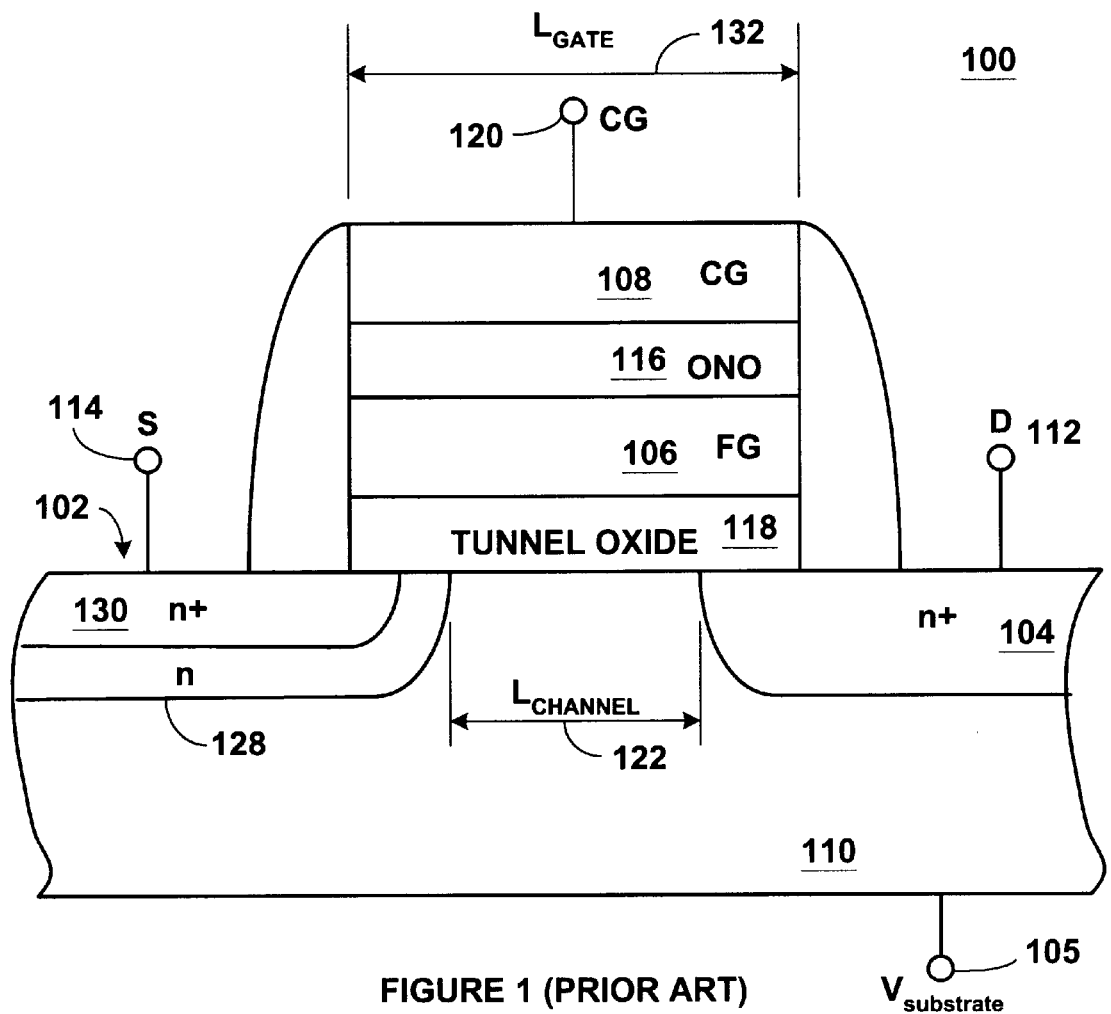
FIG. 1 shows the architecture of a typical flash memory cell with a double diffused source region.
Figure 2:
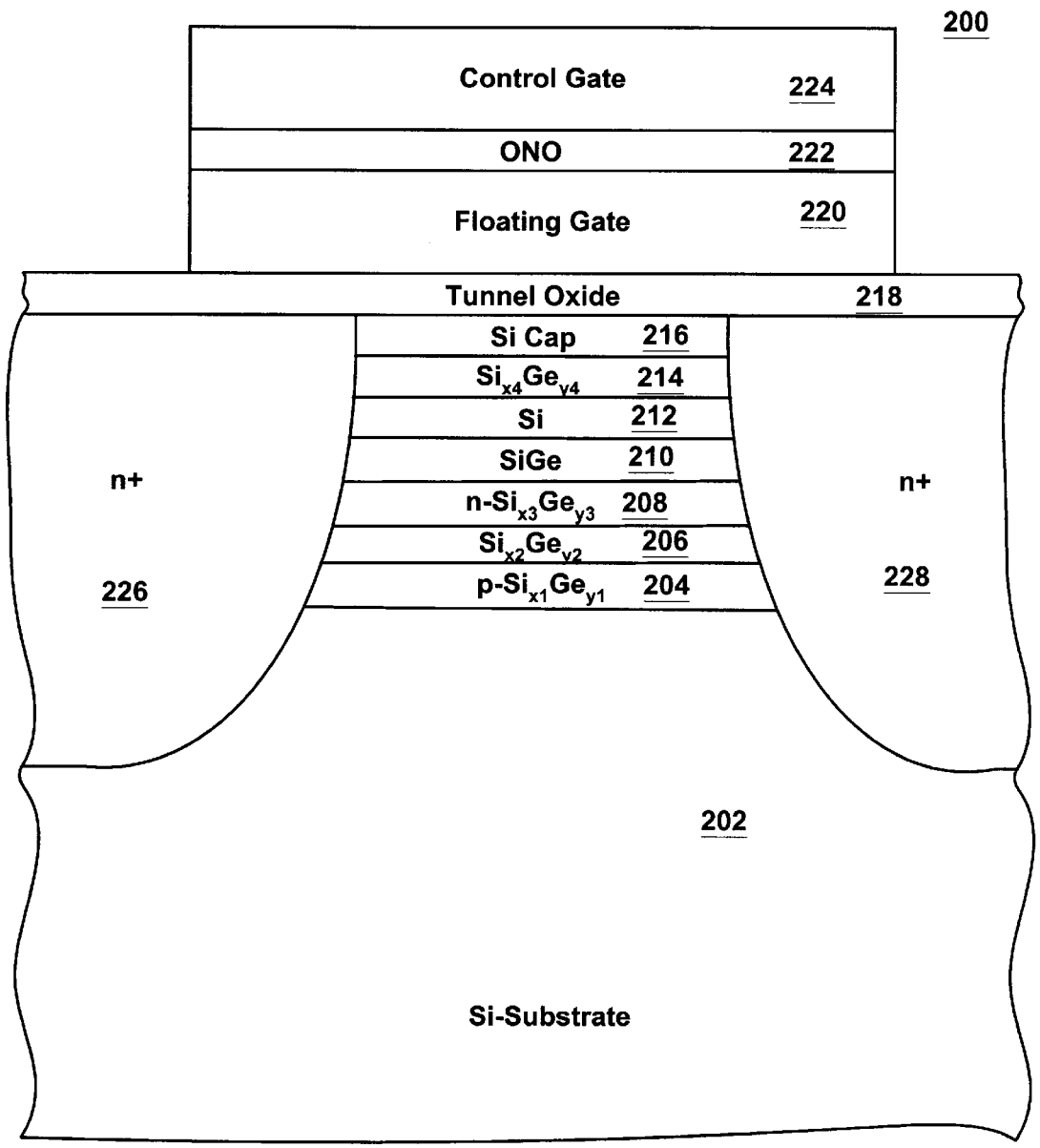
FIG. 2 shows the architecture of a flash memory cell in accordance with the present invention.

FIG. 2 shows the architecture of a portion 200 of a flash memory cell in accordance with the present invention. The portion 200 of the flash memory cell includes a semiconductor substrate 202 on and in which the flash memory cell is manufactured. A modulation-doped heterostructure is formed in the semiconductor substrate 202.

The modulation-doped heterostructure includes a p-doped layer 204 of silicon germanium having a concentration of $Si_{x1}Ge_{y1}$ where $x_1$ and $y_1$ are fractions between 0 and 1 is formed in the semiconductor substrate 202. The values of $x_1$ and $y_1$ are determined either during an empirical characterization procedure or by a computer modeling procedure. Typical values of $x_1$ and $y_1$ are approximately 0.7 and approximately 0.3, respectively. In this layer and in subsequent layers made from silicon and germanium during the computer modeling procedure, the channel charge distribution can be predicted using a 1-D analytical model and quantum mechanical solutions. Transport is modeled using 2-D drift-diffusion and hydrodynamic numerical simulations.

An undoped layer 206 of silicon germanium having a concentration of $Si_{x2}Ge_{y2}$ is formed on the layer 204 where $x_2$ and $Y_2$ are fractions between 0 and 1. The values of $x_2$ and $y_2$ are determined either during an empirical characterization procedure or by a computer modeling procedure. Typical values of $x_2$ and $Y_2$ are approximately 0.7 and approximately 0.3, respectively.

An n-doped layer 208 of silicon germanium having a concentration of $Si_{x3}Ge_{y3}$ is formed on the layer 206 where $x_3$ and $y_3$ are fractions between 0 and 1. The values of $x_3$ and $y_3$ are determined either during an empirical characterization procedure or by a computer modeling procedure. The purpose of the n-doped layer 208 is to prevent the overpopulation of the silicon cap (that is formed in a subsequent step) by providing sufficient band-bending of the conduction band. Typical values of $x_3$ and $y_3$ are 0.7 and 0.3 respectively.

An undoped layer 210 of silicon germanium is formed on the layer 208. The thin undoped layer 210 separates the electrons in the silicon channel 212 from the donors in the doped layer and aids in reducing the amounts of ionized impurity scattering and increases the electron mobility.

An undoped strained layer 212 of silicon is formed on the layer 210. The undoped strained layer 212 acts as a quantum well and becomes an electron channel under positive bias.

A layer 214 of silicon germanium having a concentration of $Si_{x4}Ge_{y4}$ is formed on the layer 212 where $x_4$ and $y_4$ are fractions between 0 and 1. The values of $x_4$ and $y_4$ are determined either during an empirical characterization procedure or by a computer modeling procedure. Typical values for $x_4$ and $y_4$ are approximately 0.7 and approximately 0.3, respectively.

A silicon cap layer 216 is formed on the layer 214 of silicon germanium, which is oxidized. The thickness of the cap layer 216 is limited to avoid the creation of a parasitic surface channel.

A tunnel oxide layer 218 is formed on the cap layer 216. A floating gate 220 is formed on the tunnel oxide layer 218. A dielectric layer 222 is formed on the floating gate and is typically formed of an oxide/nitride/oxide layer known in the semiconductor manufacturing art as an ONO layer. A control gate 224 is formed on the dielectric layer 222.

Source and drain regions 226 & 228, respectively are formed in the semiconductor substrate. The source and drain regions are typically formed by implanting appropriate ions into the substrate.

Figure 3A:
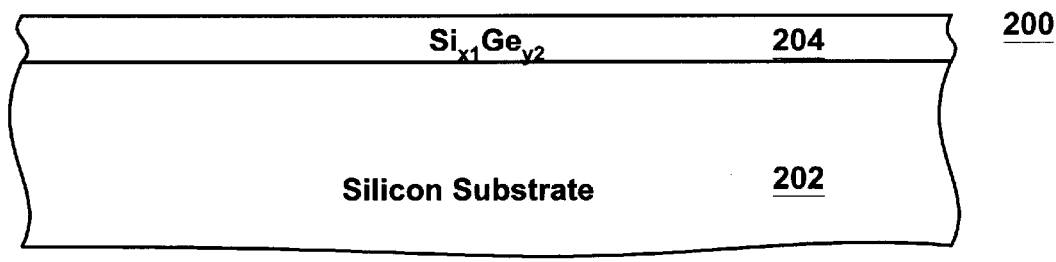
FIGS. 3A–3O illustrate a method of manufacturing the flash memory device of the present invention as shown in FIG. 2.
Figure 3B:
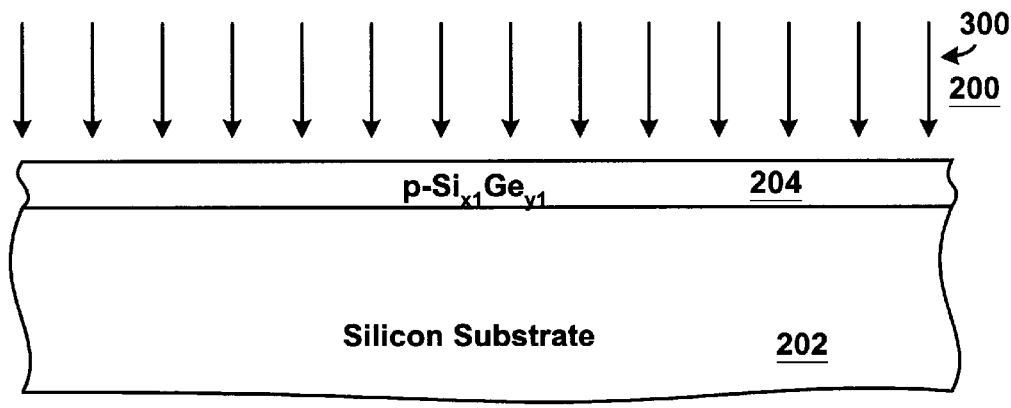
Figure 3C:
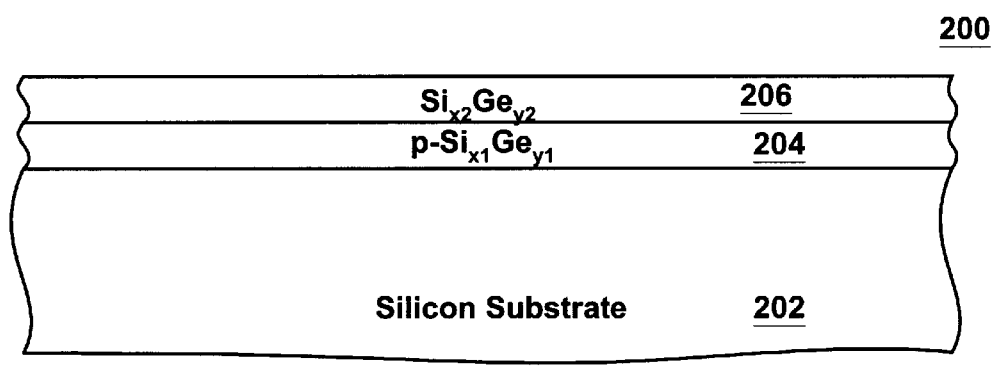
Figure 3D:
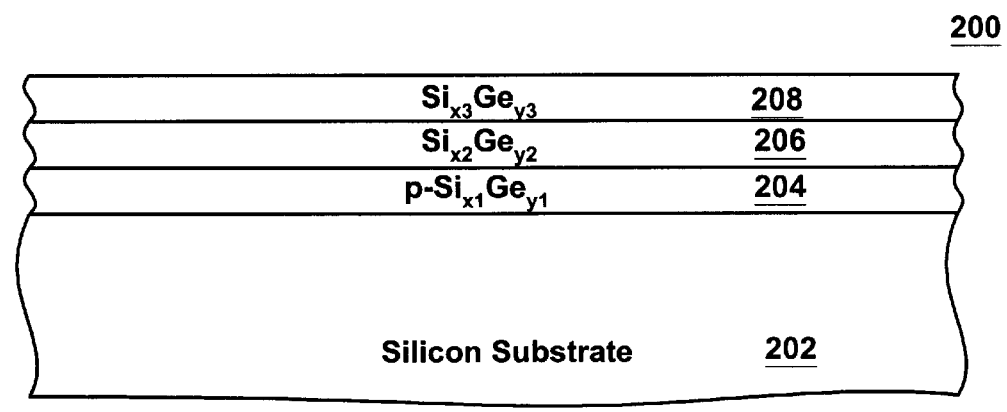
Figure 3E:
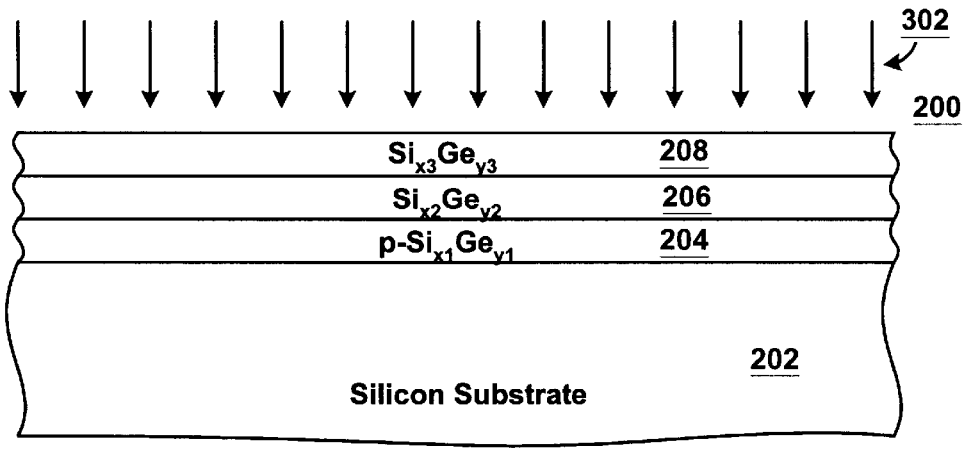
Figure 3F:
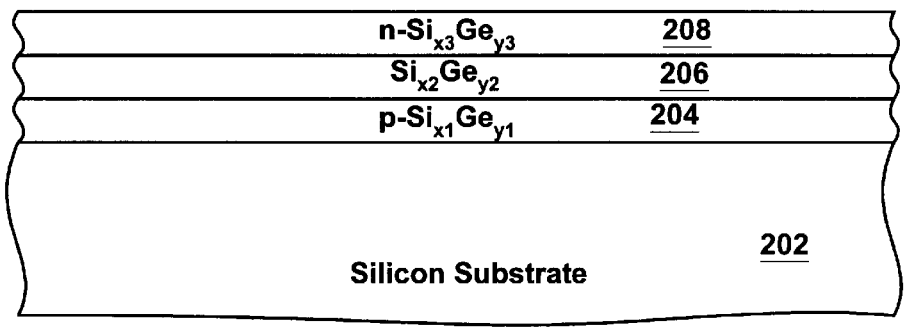
Figure 3G:
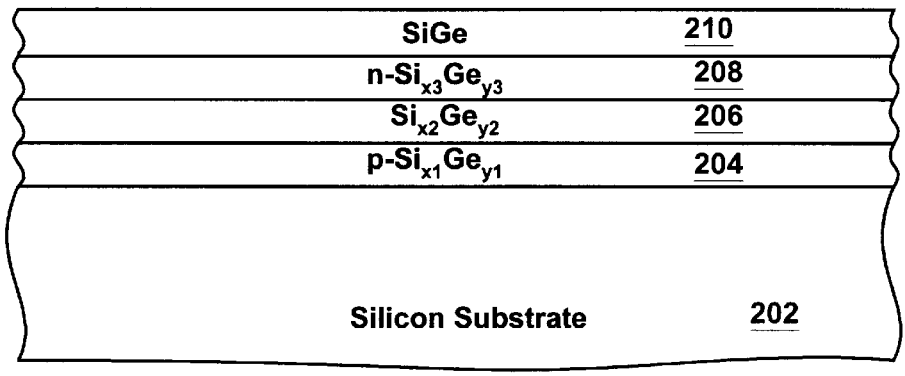
Figure 3H:
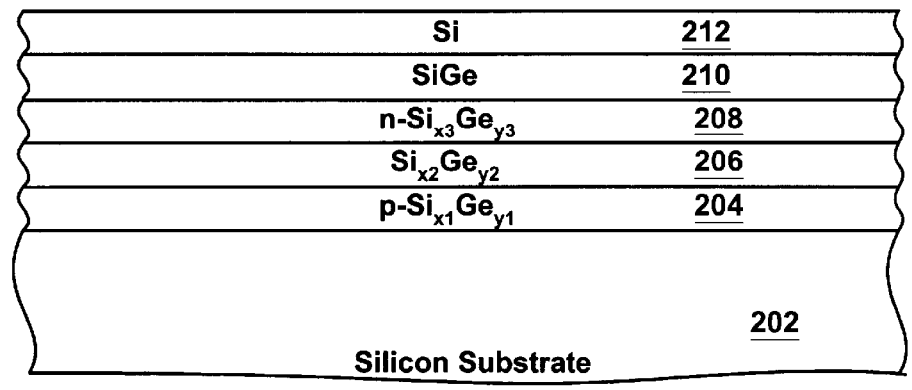
Figure 3I:
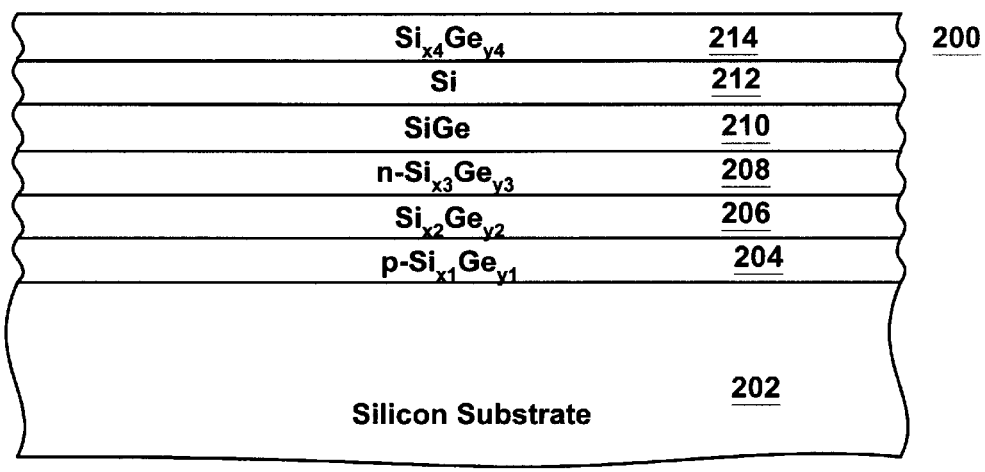
Figure 3J:
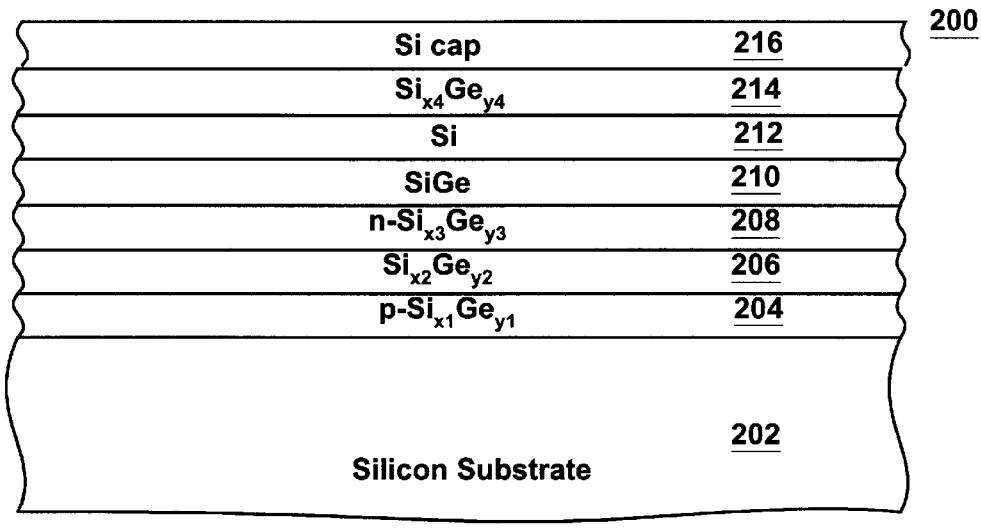
Figure 3K:
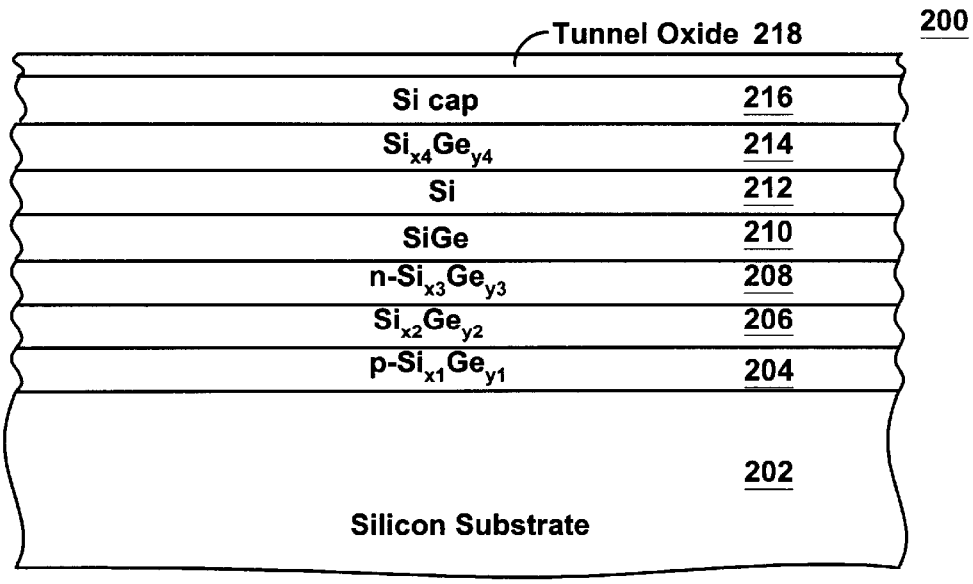
Figure 3L:
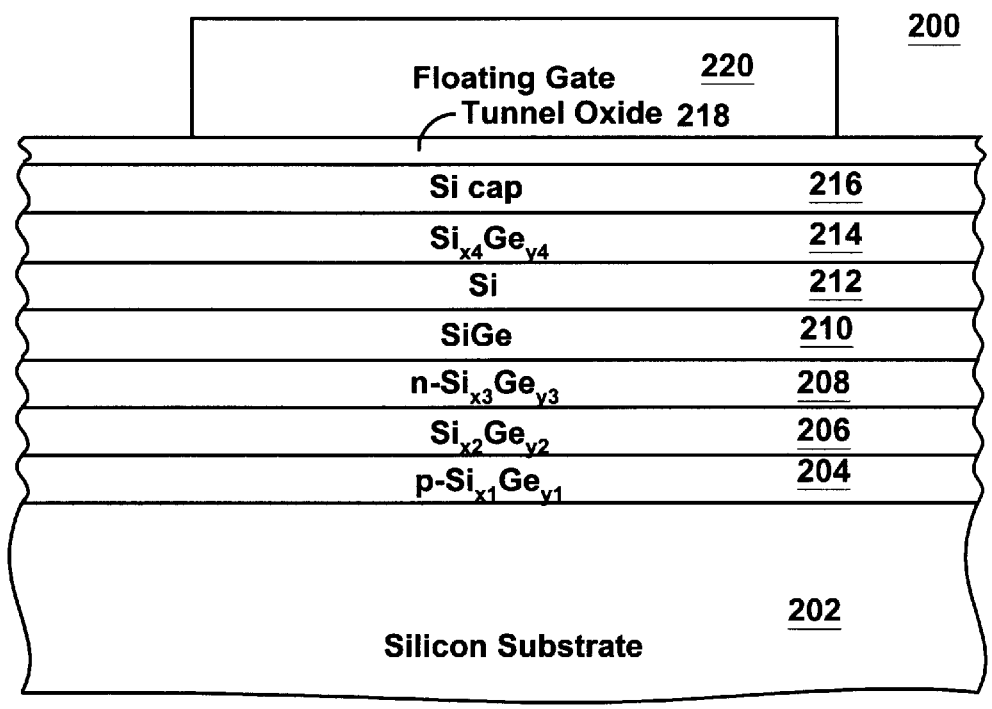
Figure 3M:
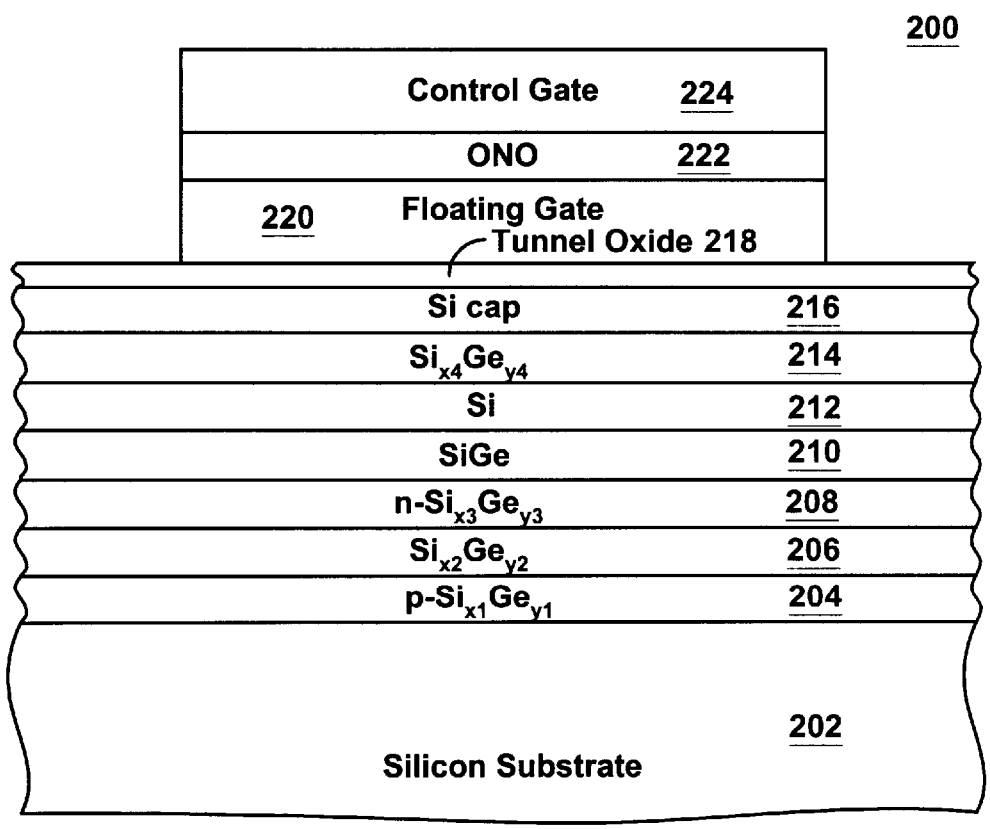
Figure 3N:
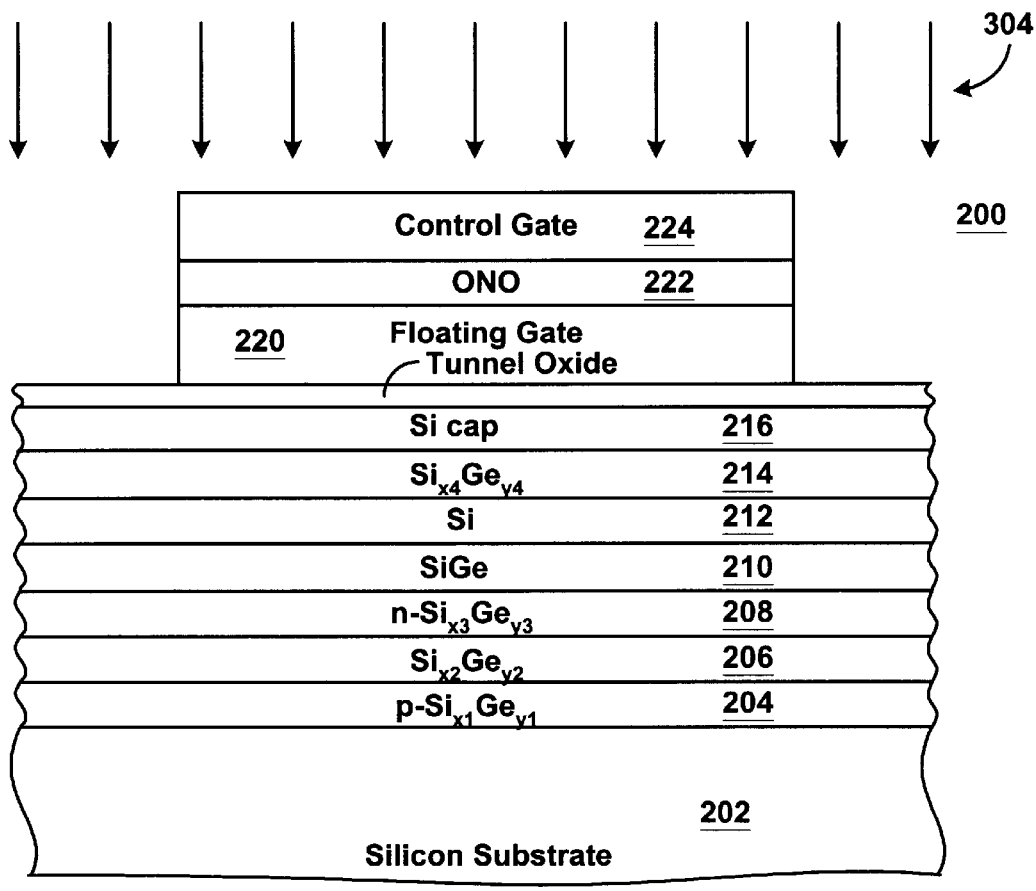
Figure 3O:
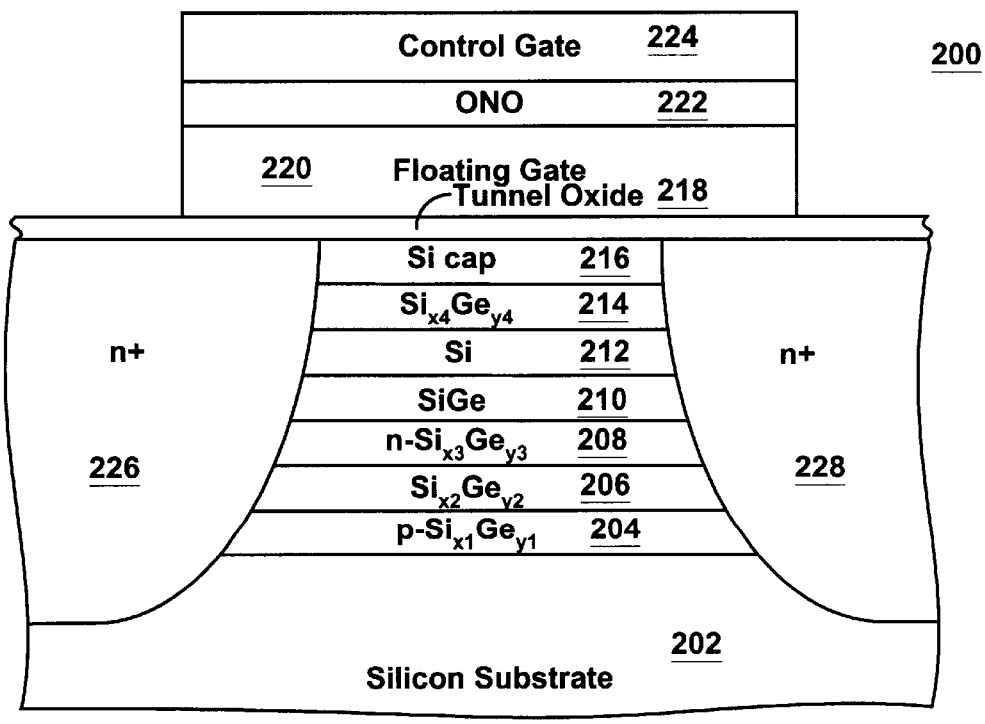

FIGS. 3A–3O illustrate a method of manufacturing the flash memory device as shown in FIG. 2. FIG. 3A shows a portion 200 of a silicon substrate on and in which the memory device will be manufactured. A first layer 204 of a mixture of silicon and germanium is formed on the portion 200 of the silicon substrate. The layer 204 of silicon germanium is formed having a concentration of $Si_{x1}Ge_{y1}$ where $x_1$ and $y_1$ are fractions between 0 and 1 and are determined in either an empirical characterization determination or by a computer modeling procedure. The method of forming a layer of silicon germanium is well known and will not be discussed. Typical values of $x_1$ and $y_1$ are approximately 0.7 and approximately 0.3 respectively.

FIG. 3B shows the portion 200 of the silicon substrate as shown in FIG. 3A with layer 204 being implanted with p type ions as indicated by arrows 300. Typical p type ions for this application are boron ions. The method of ion implantation is well known and will not be discussed.

FIG. 3C shows the portion 200 of the silicon substrate as shown in FIG. 3B with a second layer 206 of silicon germanium formed on the layer 204. The second layer 206 of silicon germanium has a concentration of $Si_{x2}Ge_{y2}$ where $x_1$ and $y_1$ are fractions between 0 and 1 and are determined in either an empirical characterization procedure or by a computer modeling procedure. The method of forming a layer of silicon germanium is well known and will not be discussed.

FIG. 3D shows the portion 200 of the silicon substrate as shown in FIG. 3C with a third layer 208 of silicon germanium formed on the layer 206. The third layer 208 of silicon germanium has a concentration of $Si_{x3}Ge_{y3}$ where $x_3$ and $y_3$ are fractions between 0 and 1 and are determined in either an empirical characterization procedure or by a computer modeling procedure. The method of forming a layer of silicon germanium is well known and will not be discussed. Typical values for $x_3$ and $y_3$ FIG. 3E shows the portion 200 of the silicon substrate as shown in FIG. 3D with layer 208 being implanted with n type ions as indicated by arrows 302. Typical n type ions for this application are either phosphorus or arsenic ions. The method of implanting ions is well known and will not be discussed.

FIG. 3F shows the portion 200 of the silicon substrate as shown in FIG. 3E showing the resulting n-type layer 208 of silicon germanium.

FIG. 3G shows the portion 200 of the silicon substrate as shown in FIG. 3F with a fourth layer 210 of silicon germanium formed on the layer 208. The fourth layer 210 of silicon germanium has a concentration of $Si_{x4}Ge_{y4}$ where $x_4$ and $y_4$ are fractions between 0 and 1 and are determined in either an empirical characterization procedure or by a computer modeling procedure. The method of forming a layer of silicon germanium is well known and will not be discussed.

FIG. 3H shows the portion 200 of the silicon substrate as shown in FIG. 3G with a layer 212 of silicon formed on the layer 210. The method of forming a layer of silicon on is will known and will not be discussed.

FIG. 3I shows the portion 200 of the silicon substrate as shown in FIG. 3H with a 214 of silicon germanium having a concentration of $Si_{x4}Ge_{y4}$ is formed on the layer 212 where $x_4$ and $y_4$ are fractions between 0 and 1. The values of $x_4$ and $y_4$ are determined in either an empirical characterization procedure or by a computer modeling procedure. The method of forming a layer of silicon germanium is well known and will not be discussed.

FIG. 3J shows the portion 200 of silicon substrate as shown in FIG. 3I with a layer 216 of silicon formed on the layer 214 of silicon germanium.

FIG. 3K shows the portion 200 of the silicon substrate as shown in FIG. 3J with a layer 218 of oxide formed on the layer 216 of silicon. Oxidizing the layer 216 of silicon forms the layer 218 of tunnel oxide.

FIG. 3L shows the portion 200 of the silicon substrate as shown in FIG. 3K with a floating gate 220 formed on the layer 218 of tunnel oxide. The method of forming a floating gate is well known and will not be discussed.

FIG. 3M shows the portion 200 of silicon substrate as shown in FIG. 3L with a dielectric layer 222 formed on the floating gate 220 and a control gate 224 formed on the dielectric layer 222. The dielectric layer 222 is typically an oxide/nitride/oxide layer known as an ONO layer. The methods of forming a dielectric layer and a control gate are well known in the art and will not be discussed.

FIG. 3N shows the portion 200 of silicon substrate as shown in FIG. 3M being implanted with n+ ions as indicated by arrows 304. The method of implanting the n+ ions is well known and will not be discussed.

FIG. 3O shows the portion 200 of silicon substrate as shown in FIG. 3N with the n+ regions 226 and 228 formed in the silicon substrate 202. Subjecting the silicon substrate to a heat treatment that drives the n+ ions to their final depth forms the n+ regions. Such a heat treatment is well known in the art and will not be discussed.

In summary, the present invention overcomes the limitations of the prior art and fulfills the need for a flash memory that provides a flash memory device with increased carrier mobility and drive current that permits a larger window of operation and that allows a continued scaling of the dimension of the flash memory device.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A flash memory device comprising:

a modulation-doped heterostructure in a semiconductor substrate, wherein the modulation-doped heterostructure comprises a layer of silicon that acts as a quantum well that becomes an electron channel under positive bias;

a layer of tunnel oxide on a surface of the semiconductor substrate over the heterostructure;

a floating gate on the layer of tunnel oxide;

a layer of dielectric on the floating gate;

a control gate on the layer of dielectric; and a source region and a drain region in the semiconductor substrate.

2. The flash memory device of claim 1 wherein the modulation-doped heterostructure further comprises a layer of silicon germanium and a silicon cap layer on the layer of silicon.

3. The flash memory device of claim 2 wherein the modulation-doped heterostructure further comprises:
- an n-dpoed layer of silicon germanium;
- a p-doped layer of silicon germanium;
- a spacer layer between the n-doped lkayer of silicon germanium and the p-doped layer of silicon germanium; and
- a set back layer between the n-doped layer and the layer of silicon.

4. The flash memory device of claim 3 wherein the spacer layer is a layer of silicon germanium.

5. The flash memory device of claim 4 wherein the layer of silicon germanium on the layer of silicon has a concentration of $Si_{x4}Ge_{y4}$ where $x_4$ and $y_4$ are fractions between 0 and 1.

6. The flash memory device of claim 5 wherein $x_4$ and $y_4$ satisfy the following conditions:

$0.3 \leq x_4 \leq 0.7$; and $0.5 \leq y_4 \leq 0.7$.

7. The flash memory device of claim 6 wherein the n-doped layer of silicon germanium has a concentration of $Si_{x3}Ge_{y3}$ wherein $x_3$ and $y_3$ are fractions between 0 and 1.

8. The flash memory device of claim 7 wherein $x_3$ and $y_3$ satisfy the following conditions:

$x_3$=approximately 0.7; and $y_3$=approximately 0.3.

9. The flash memory device of claim 8 wherein the p-doped layer of silicon germanium has a concentration of $Si_{x1}Ge_{y1}$ wherein $x_1$ and $y_1$ are fractions between 0 and 1.

10. The flash memory device of claim 9 wherein $x_1$ and $y_1$ satisfy the following conditions:

$x_1$=approximately 0.7; and $y_1$=approximately 0.3.

11. The flash memory device of claim 10 wherein the spacer layer of silicon germanium has a concentration of $Si_{x2}Ge_{y2}$ wherein $x_2$ and $y_2$ are fractions between 0 and 1.

12. The flash memory device of claim 11 wherein $x_2$ and $y_2$ satisfy the following conditions:

$x_2$=approximately 0.7; and $y_2$=approximately 0.3.

* * * * *